United States Patent
Thesbjerg et al.

(10) Patent No.: US 11,821,402 B2
(45) Date of Patent: Nov. 21, 2023

(54) WIND TURBINE ROTOR BLADE DESIGN

(71) Applicant: VESTAS WIND SYSTEMS A/S, Aarhus N. (DK)

(72) Inventors: Leo Thesbjerg, Ringkøbing (DK); Søren Hove Sørensen, Hinnerup (DK); Gustavo Oliveira Violato, Risskov (DK)

(73) Assignee: VESTAS WIND SYSTEMS A/S, Aarhus N (DK)

( * ) Notice: Subject to any disclaimer, the term of this patent is extended or adjusted under 35 U.S.C. 154(b) by 0 days.

(21) Appl. No.: 17/987,237

(22) Filed: Nov. 15, 2022

(65) Prior Publication Data
US 2023/0151793 A1 May 18, 2023

(51) Int. Cl.
*F03D 1/06* (2006.01)
*G06F 30/17* (2020.01)

(52) U.S. Cl.
CPC .......... *F03D 1/0675* (2013.01); *G06F 30/17* (2020.01); *F05B 2230/00* (2013.01); *F05B 2270/332* (2013.01)

(58) Field of Classification Search
CPC .... F03D 1/0633; F03D 1/0641; F03D 1/0675; F03D 1/0683
See application file for complete search history.

(56) References Cited

U.S. PATENT DOCUMENTS

| | | | |
|---|---|---|---|
| 10,451,031 B2* | 10/2019 | Merzhaeuser | F03D 1/0675 |
| 10,564,066 B2* | 2/2020 | Greaves | G01M 7/022 |
| 2012/0227515 A1 | 9/2012 | Guy et al. | |

OTHER PUBLICATIONS

"Loads and site conditions for wind turbines"; DNVGL; Edition Nov. 2016 (Year: 2016).*
Extended European Search Report for European Patent Application No. 21208272.1-1002, dated May 18, 2022.
Information on Search Strategy for European Patent Application No. 21208272.1-1002, dated May 18, 2022.
Griffin D A, "Blade System Design Studies vol. 11: Preliminary Blade Designs and Recommend Test Matrix", Sand Control, XX, XX, Jun. 1, 2004, pp. 3-38, XP003030879.
Vera-Tudela Luis et al., "Analysing wind turbine fatigue load prediction: The impact of wind farm flow conditions", Renewable Energy, vol. 107, pp. 352-360, XP029940980, ISSN0960-1481, DOI: 10.1016/J.RENENE.2017.01.065.

* cited by examiner

*Primary Examiner* — Justin D Seabe
(74) *Attorney, Agent, or Firm* — Patterson + Sheridan, LLP (57) ABSTRACT

A method of designing a wind turbine rotor blade. The method includes selecting a gravity load safety factor associated with wind turbine rotor blade fatigue loading due to gravity, that is selected to be less than a defined wind load safety factor associated with wind turbine rotor blade fatigue loading that is not due to gravity. The method includes determining a gravity-corrected design load for wind turbine rotor blade deflection, that is determined based on the selected gravity load safety factor and the defined wind load safety factor. The method includes designing a gravity-corrected wind turbine rotor blade in accordance with the determined gravity-corrected design load.

14 Claims, 4 Drawing Sheets

WIND TURBINE ROTOR BLADE DESIGN

FIELD OF THE INVENTION

The invention relates to a method of designing a wind turbine rotor blade and, in particular, to determining a reduced fatigue load safety factor and designing the wind turbine rotor blade in accordance with a design load determined based on the reduced fatigue load safety factor.

BACKGROUND

Wind turbine rotor blades continue to increase in size, and therefore weight, in the drive to ever increase the wind energy capturing capability of wind turbines. As such, the loads that certain wind turbine components or parts experience and need to withstand as a result of heavier rotor blades are also increasing.

There are different types of loads that wind turbine components need to withstand over a lifetime of the components, e.g. expected ultimate loads that will be experienced over the component lifetime, and fatigue loads caused by the cyclical or periodic nature of wind turbine operation (i.e. the rotational motion of the rotor and blades). Loading on wind turbine rotor blades may arise from a number of different sources, such as aerodynamical, gravitational, centrifugal, gyroscopic, and operational sources.

Deflection of wind turbine rotor blades in different directions may be caused by different sources of loading. For instance, blade deflection in a flapwise direction may be predominantly as a result of aerodynamical loading, whereas blade deflection in an edgewise direction may predominantly be as a result of gravitational loading. As gravitational loading is mass dependent, then rotor blades of greater mass result in greater edgewise loads.

An issue occurs if the mass of a rotor blade is such that the expected loading on one or more wind turbine components caused by the rotor blade exceeds the loading capacity of the components. In one case, the expected fatigue loading on certain components exceeds their capacity. It is therefore desired to provide a wind turbine rotor blade design that optimises wind energy capture capability while staying within loading capacity limits of wind turbine components.

It is against this background to which the present invention is set.

SUMMARY OF THE INVENTION

According to an aspect of the present invention there is provided a method of designing a wind turbine rotor blade. The method comprises: a) selecting a gravity load safety factor associated with wind turbine rotor blade fatigue loading due to gravity, the gravity load safety factor being selected to be less than a defined wind load safety factor associated with wind turbine rotor blade fatigue loading that is not due to gravity; b) determining a gravity-corrected design load for wind turbine rotor blade deflection or bending, the gravity-corrected design load being determined based on the selected gravity load safety factor and the defined wind load safety factor; and, c) designing a gravity-corrected wind turbine rotor blade in accordance with the determined gravity-corrected design load.

The method may comprise determining a gravity-corrected probability of failure of the designed gravity-corrected rotor blade for a fatigue failure mode due to blade deflection. If the determined gravity-corrected probability of failure is greater than a reference probability of failure for the fatigue failure mode, then the method may comprise increasing the selected gravity load safety factor and repeating steps b) and c). On the other hand, if the determined gravity-corrected probability of failure is lower than the reference probability of failure for the fatigue failure mode, then the method may comprise decreasing the selected gravity load safety factor and repeating steps b) and c).

Determining the gravity-corrected probability of failure may comprise specifying a direction of blade deflection for the fatigue failure mode.

The method may comprise using a defined total load model to predict a total load indicative of fatigue loading of the designed gravity-corrected rotor blade during wind turbine operation. The method may comprise using a defined gravity load model to predict a gravity load indicative of fatigue loading due to gravity of the designed gravity-corrected rotor blade during wind turbine operation. The method may comprise determining a wind load signal indicative of fatigue loading not due to gravity of the designed gravity-corrected rotor blade during wind turbine operation. The wind load signal may be determined based on the total load and the gravity load. The gravity-corrected probability of failure may be determined based on a limit state equation including an uncertainty associated with a signal indicative of the gravity load and an uncertainty associated with the wind load signal.

Defining the gravity load model may comprise setting one or more parameters of the defined total load model as follows: setting a turbulence parameter equal to, or substantially equal to, zero; setting a wind shear parameter equal to, or substantially equal to, zero; increasing the value of a structural damping parameter for flapwise and edgewise oscillations of the designed rotor blade by at least one order of magnitude, and preferably by at least two orders of magnitude.

The method may comprise designing a standard wind turbine rotor blade in accordance with a standard design load that is based on a standard load safety factor associated with wind turbine rotor blade fatigue loading. The method may comprise determining the reference probability of failure as a probability of failure of the standard rotor blade for the fatigue failure mode due to blade deflection in a flapwise direction.

The method may comprise using a defined total load model to predict a total load indicative of fatigue loading of the standard rotor blade during wind turbine operation. The method may comprise using a defined gravity load model to predict a gravity load indicative of fatigue loading of the standard rotor blade during wind turbine operation. The method may comprise determining a wind load signal indicative of fatigue loading not due to gravity of the standard rotor blade during wind turbine operation based on the total and gravity loads for the standard rotor blade. The reference probability of failure may be determined based on a limit state equation including an uncertainty associated with the wind load signal for the standard rotor blade.

The wind load safety factor may be defined to be equal to the standard load safety factor. Optionally, the standard load safety factor is obtained from an industry standard. Further optionally, the standard load safety factor is equal to one.

The gravity-corrected design load may be determined based on the gravity load safety factor applied to a signal indicative of the gravity load for the standard rotor blade and on the wind load safety factor applied to the wind load signal for the standard rotor blade.

The wind load signal may be a standard deviation of the fatigue loading not due to gravity of the standard rotor blade during wind turbine operation. The wind load signal may be determined based on a determined standard deviation of the gravity load. The gravity-corrected design load may be determined based on the gravity load safety factor applied to the gravity load standard deviation for the standard rotor blade and on the wind load safety factor applied to the standard deviation of the fatigue loading not due to gravity of the standard rotor blade.

The standard deviation $\sigma_{ag}$ of the gravity load may be obtained according to $$L_{ag}{}^m N_{ref} = (2\sqrt{2}\sigma_{ag})^m f_g T_L,$$

where m is a considered slope of an SN-curve, $T_L$ is a design lifetime of the rotor blade, $L_{ag}$ is the gravity load for a reference number of load cycles $N_{ref}$, and $f_g$ is a frequency of a sinusoidal load signal corresponding to a frequency of the gravity load.

The standard deviation $\sigma_{aw}$ of the fatigue loading not due to gravity may be obtained according to $$L_a^m N_{ref} = (2\sqrt{2}\sigma_{ag})^m \Gamma\left(1 + \frac{m}{2}\right) M\left(-\frac{m}{2}, 1, -\left(\frac{\sigma_{ag}}{\sigma_{aw}}\right)^2\right) \nu T_L$$

where $L_a$ is the total load for the reference number of load cycles $N_{ref}$, $M(\cdot,\cdot,\cdot)$ is a confluent hypergeometric function, and $\nu$ is an average frequency of load cycles.

The gravity load safety factor may be selected to be equal to, or approximately equal to, 0.9. Optionally, the gravity load safety factor is increased by an increment of approximately 0.01 prior to repeating steps b) and c).

One or more steps of the defined method may be computer-implemented. Selecting the gravity load safety factor may comprise the selection being received by a computer implementing one or more subsequent steps of the method.

The method may comprise manufacturing the gravity-corrected wind turbine rotor blade designed in accordance with the determined gravity-corrected design load.

According to another aspect of the invention there is provided a non-transitory, computer-readable storage medium storing instructions thereon that when implemented on one or more computer processors cause the one or more computer processors to perform the method defined above.

According to another aspect of the invention there is provided a computer device for designing a wind turbine rotor blade. The computer device is configured to receive a selected gravity load safety factor associated with wind turbine rotor blade fatigue loading due to gravity, the gravity load safety factor being selected to be less than a defined wind load safety factor associated with wind turbine rotor blade fatigue loading that is not due to gravity. The computer device is configured to determining a gravity-corrected design load for wind turbine rotor blade deflection, the gravity-corrected design load being determined based on the selected gravity load safety factor and the defined wind load safety factor. The computer device is configured to design a gravity-corrected wind turbine rotor blade in accordance with the determined gravity-corrected design load. The computer device may be, or include, a computer processor configured to perform the defined method steps.

According to another aspect of the invention there is provided a wind turbine rotor blade designed in accordance with the method defined above.

According to another aspect of the invention there is provided a method of designing a structural component of a wind turbine. The method comprises selecting a gravity load safety factor associated with wind turbine structural component fatigue loading due to gravity, the gravity load safety factor being selected to be less than a defined wind load safety factor associated with wind turbine structural component fatigue loading that is not due to gravity. The method comprises determining a gravity-corrected design load for wind turbine structural component deflection, the gravity-corrected design load being determined based on the selected gravity load safety factor and the defined wind load safety factor. The method comprises designing a gravity-corrected wind turbine structural component in accordance with the determined gravity-corrected design load.

BRIEF DESCRIPTION OF THE DRAWINGS

Examples of the invention will now be described with reference to the accompanying drawings, in which.

DETAILED DESCRIPTION OF EMBODIMENTS

Figure 1:
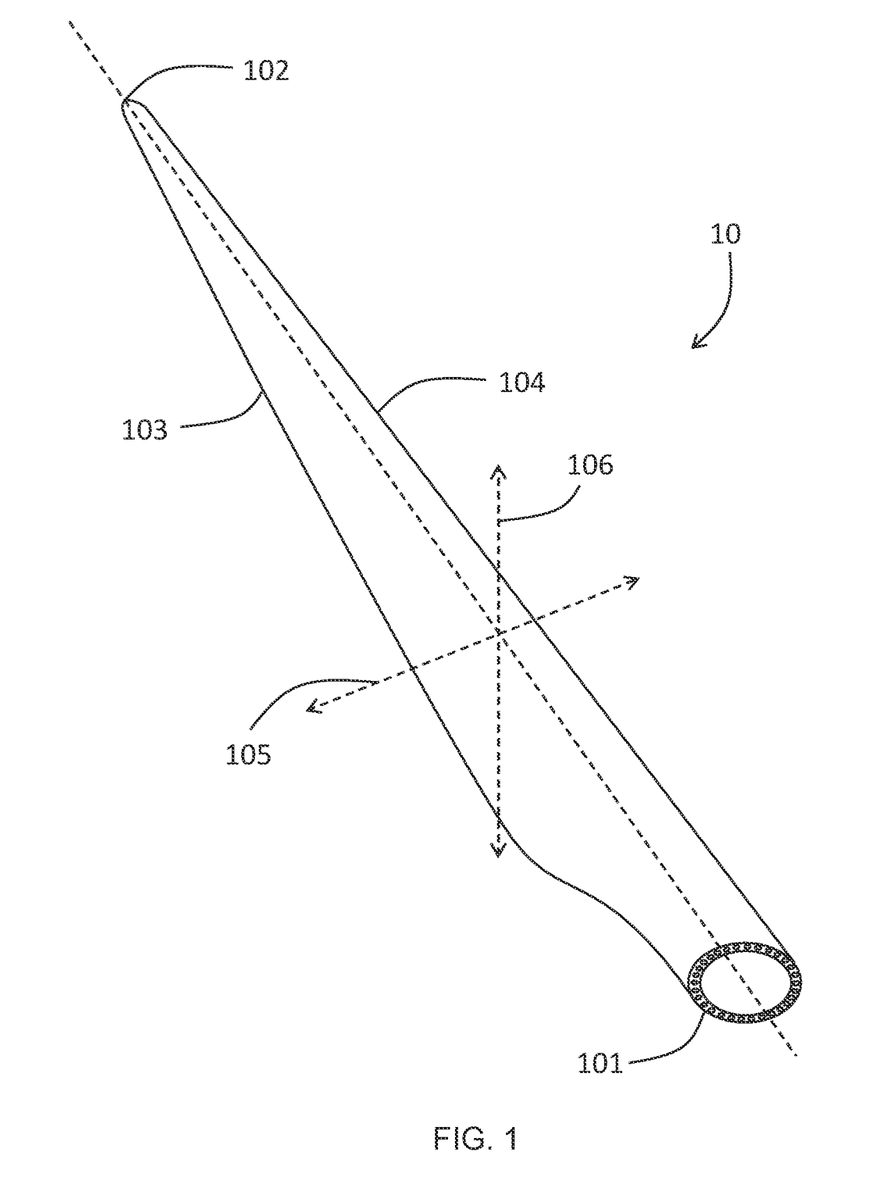
FIG. 1 schematically illustrates a wind turbine rotor blade designed in accordance with an example of the invention.

The invention relates to design of a wind turbine rotor blade, such as the rotor blade 10 illustrated schematically in FIG. 1. As shown, the blade 10 includes a root end 101 where the blade is mounted to a rotor hub of a wind turbine, and a tip end 102 opposite to the root end 101. The blade 10 is generally of airfoil shape and has a leading edge 104 and a trailing edge 103. The blade 10 defines edgewise 105 and flapwise directions 106. During operation of a wind turbine, the rotor blade 10 can experience edgewise and flapwise vibrations.

The design of the rotor blade 10 influences the efficiency of energy capture during wind turbine operation. However, the design of the rotor blade 10 also influences loading experienced by various components of the wind turbine 10 during operation. The rotor blade 10 is therefore to be designed to maximise energy capture while minimising component loading. In particular, the rotor blade 10 is designed in accordance with relevant standards governing structural design. Specifically, the integrity of load-carrying components of the wind turbine structure need to be verified and an acceptable safety level needs to be ascertained for a particular design of the rotor blade 10. The ultimate and fatigue strength of structural members need to be verified by calculations and/or tests to demonstrate the structural integrity of the wind turbine with the appropriate safety level for a given design of the rotor blade 10.

For a particular design of the rotor blade 10, it needs to be verified that limit states of the wind turbine structure are not exceeded. The limit state is the state of a structure and the loads acting upon it, beyond which the structure no longer satisfies the design requirement. Indeed, the purpose of design calculations—i.e. the deign requirement for the limit state— is to keep the probability of a limit state being reached below a certain value prescribed for the wind turbine structure.

Different types of loads experienced by the wind turbine during operation may be considered as part of the limit state verification process. For instance, gravitational and inertial loads are loads that result from gravity, vibration and rotation. Aerodynamic loads are static and dynamic loads that are caused by the airflow and its interaction with the stationary and moving parts of the wind turbine. The airflow may be dependent upon wind speed and turbulence across the rotor plane, the rotational speed of the wind turbine rotor, density of the air, and aerodynamic shapes of the wind turbine components and their interactive effects. Other loads such as loads associated with actuating and controlling components of the wind turbine, wake loads, impact loads, ice loads, etc. may also be considered.

A number of design load cases may be considered during design of the rotor blade 10. In particular, the life of a wind turbine can be represented by a set of design situations covering conditions that the wind turbine may experience. The design load cases are used to verify the structural integrity of the wind turbine. Design load analysis can include analysis of ultimate or extreme loads and fatigue loads. The different types of loads mentioned above may be taken into account for the analysis of each design load case. The analysis may be performed with the use of an aeroelastic dynamics model to predict design loads.

Partial safety factors are used as part of the limit state analysis for wind turbine structures. Partial safety factors account for uncertainties and variability in loads and resistances, the uncertainties in the particular analysis methods being used, and the importance of the particular structural components of the wind turbine with respect to the consequences of failure. In particular, the uncertainty and variability in loads is taken into account by the following safety factor:

$$F_d = \gamma_f F_k$$

where $F_d$ is the design value/load for the aggregated internal load or load response to multiple simultaneous load components from various sources for a given design load case, $\gamma_f$ is the partial safety factor for loads, and $F_k$ is a characteristic value for the load, typically a value of the load having a prescribed probability of not being attained (that is, an exceedance probability of less than or equal to the prescribed amount).

Dynamic simulations utilising a structural dynamics model may typically be used to calculate wind turbine loads. The total period of load data needs to be sufficiently long to ensure statistical reliability of the estimate of the characteristic load value.

As mentioned above, both ultimate and fatigue loading can be considered as part of the structural analysis. For ultimate loading, the characteristic value of load may be determined by a statistical/probabilistic analysis of the ultimate loading that occurs for normal design situations. This could correspond to, for instance: the extreme value among average values of extremes over a certain time period (e.g. ten minutes) for each wind speed in a given range and multiplied by a constant; the extreme value among the 1st or 99th percentile values over a certain time period for each wind speed in a given range and multiplied by a constant; or, the value corresponding to a 50-year return period, based on load extrapolation methods. The design load is obtained by multiplying the characteristic loads by the partial safety factor for a particular design load case.

For fatigue loading, fatigue damage may be estimated using an appropriate fatigue damage calculation. For instance, the limit state may be reached when accumulated damage exceeds a specified value, e.g. one. The accumulated damage over the design lifetime of the wind turbine should therefore be less than the specified value. Fatigue damage calculations will typically consider effects of cyclic range and mean strain/stress levels. Partial safety factors may be applied to the cyclic strain range for assessing the increment of damage associated with each fatigue cycle. The partial safety factor for fatigue loads is typically a defined, constant value, e.g. one.

In the drive to increase the energy capture capability of wind turbines, the size (and mass) of rotor blades continues to increase. An issue arises when loads experienced by structural components of the wind turbine exceed their capacity. In one example, the fatigues loads of the blade root inserts of a wind turbine exceed their limits as a result of heavier rotor blades.

The inventors of the present invention have realised that, for the design of a wind turbine rotor blade, a lower safety factor may be used for the part of the fatigue loading of a wind turbine rotor blade that arises as a result of gravitational forces relative to a safety factor for the part of the fatigue loading not arising from gravity, while still staying within acceptable fatigue failure probability limits. This is because the uncertainty associated with blade fatigue loading due to gravity is lower than the uncertainty associated with blade fatigue loading due to wind effects. In other words, fatigue loading due to wind is less predictable than the fatigue loading due to gravity. Beneficially, the use of separate safety factors for fatigue loading allows for optimising material usage in rotor blade design without compromising on structural safety.

A corresponding approach may be used for ultimate loading. However, while it is the case that ultimate loading of a rotor blade may readily be split into a part arising due to gravity and a part arising due to effects other than gravity (e.g. predominantly wind), such a split is not so readily possible for fatigue loading. In particular, for fatigue loading the entire time series modelling the loads over time needs to be considered. The approach for fatigue loading therefore needs to be formulated as a probability problem. There is also a question over what value the lower safety factor for fatigue loading due to gravity should take. These points will be addressed in more detail below.

An important point when considering rotor blade loading is that different forces may be predominantly responsible for loading in different directions. In particular, blade loading in the flapwise direction may be caused predominantly by variations in the wind conditions in the vicinity of the wind turbine, e.g. due to wind 'pushing' towards the tower (there may be approximately zero contribution from gravity in this direction). On the other hand, blade loading in the edgewise direction may be driven mainly by gravity (e.g. 80-90% of edgewise loading may be due to gravity). As there is greater variation in wind forces compared to gravitational forces experienced by the rotor blades (i.e. there is more control over the gravitational forces that are experienced), then there is a higher degree of uncertainty associated with flapwise loading than edgewise loading. A lower safety factor for gravity therefore means a smaller design load in the edgewise direction, meaning that the rotor blade can beneficially be designed using less material.

The following describes how, when designing a rotor blade, a reduced load factor can be applied for the so-called 'gravity part' of a fatigue load relative to the load factor applied for the so-called 'wind part' of the fatigue load (i.e. the loading not arising due to gravity), while the probability of failure in the edgewise direction (where gravity is dominant) of the blade is less than (or at least similar to) the probability of failure in the flapwise direction (where wind variation is dominant). The probability of failure may be determined using methods known in the art.

When a separate load factor is to be used for the gravity part of the edgewise fatigue load, then the total load on the blade needs to be split up into a gravity part and the wind part of the fatigue load. The total load may be obtained from standard or normal simulations for predicting loads of a model of the designed rotor blade. Such simulations may be performed using any suitable software package, e.g. Vestas Turbine Simulator (VTS).

The loads to be used for the determination of a reduced load factor for the gravity part ('gravity-corrected load factor' or 'gravity load safety factor') are the resulting equivalent fatigue loads for a considered slope of an SN-curve, m (i.e. a curve of applied loading S against number of cycles to failure N), found from a full load spectrum used for a fatigue analysis covering the design lifetime, denoted $T_L$. The equivalent fatigue loads denoted L are found for a reference number of cycles, $N_{ref}$. The equivalent loads are cyclic loads with a constant amplitude/range.

The gravity part/load may be obtained from a separate set of simulations where excitations from the wind are eliminated to the extent that is possible, such that the simulated load is (at least predominantly) representing gravity. In particular, the gravity load may be obtained from simulations that are different from a standard fatigue analysis in that a high blade damping may be used to suppress the dynamic effects from the wind load, and that includes no turbulence and no wind shear.

However, the wind load cannot be obtained from a further different set of simulations. Also, as the fatigue load is a measure of the load ranges/cycles in a time series, then the contribution from the wind part/load cannot simply be obtained as the difference between the total load and gravity load. This is because it will depend heavily on a correlation between the two, and the dominating frequencies in the two signals.

The described approach to separate the total load $L_a$ for a given direction α into a gravity part $L_{ag}$ and a wind part $L_{aw}$ is to determine the underlying standard deviation for each of the two signals, denoted $\sigma_{ag}$ and $\sigma_{aw}$, respectively. For that purpose, two equations for the equivalent loads representing the gravity load and total load, written in terms of the standard deviations, are used.

It may be assumed that the gravity load can be represented by a sinusoidal signal. Then the relation between the equivalent load and the standard deviation may be expressed by $$L_{ag}^m N_{ref} = (2\sqrt{2}\sigma_{ag})^m f_g T_L$$

where $f_g$ is the frequency of the sinusoidal load signal corresponding to 1P (i.e. the frequency for the gravity load).

An equation for the total load assumes that the wind load can be represented by a narrow-banded Gaussian process, meaning that the load ranges will be Rayleigh distributed. Under these assumptions, the total load may be expressed in terms of the underlying standard deviations according to $$L_a^m N_{ref} = (2\sqrt{2}\sigma_{ag})^m \Gamma\left(1 + \frac{m}{2}\right) M\left(-\frac{m}{2}, 1, -\left(\frac{\sigma_{ag}}{\sigma_{aw}}\right)^2\right) \nu T_L$$

where $M(\cdot,\cdot,\cdot)$ is a confluent hypergeometric function, and ν is an average frequency of load cycles.

To estimate this frequency, the following function is defined for the nth order moment of the energy spectrum for the total load:

$$\lambda(n) = \sigma_{ag}^2 f_g^n + \sigma_{aw}^2 f_w^n$$

where $f_w$ is the dominating frequency of the wind load. The frequency ν is taken as the zero-crossing frequency estimated according to $$\nu = \sqrt{\frac{\lambda(2)}{\lambda(0)}}$$

Given the equivalent loads for the total load $L_a$ and the gravity load $L_{ag}$ from the simulations, the standard deviation of the gravity load $\sigma_{ag}$ is found from the above relation linking the equivalent load $L_{ag}$ and standard deviation $\sigma_{ag}$. Then, the standard deviation of the wind load $\sigma_{aw}$ may be found using the equation including the confluent hypergeometric function above, where the frequency ν is obtained using the expressions for λ(n) and ν above. It is noted that the equation for $\sigma_{aw}$ is nonlinear, and needs to be found by an iterative approach.

It is noted that the equivalent wind load $L_{aw}$ is still unknown, and it may not actually be estimated. Instead of using the equivalent loads for the gravity and the wind to calculate the gravity-corrected load safety factor, the respective calculated standard deviations will be used. It is assumed that each equivalent fatigue load is proportional to its respective standard deviation, such that this approach will result in the same value as if the loads were used.

As mentioned above, $\gamma_f$ is the partial safety factor for loads. So, $\gamma_f$ is taken as the standard load factor for fatigue (which according to industry standards may be equal to one), and $\gamma_g$ is taken to be the load factor for gravity. The design load $L_{ad}$ may then be found using the above equation for $L_a^m N_{ref}$ where the standard deviations are multiplied by the associated load factors, i.e. according to $$L_{ad}^m N_{ref} = (2\sqrt{2}\gamma_g\sigma_{ag})^m \Gamma\left(1 + \frac{m}{2}\right) M\left(-\frac{m}{2}, 1, -\left(\frac{\gamma_g\sigma_{ag}}{\gamma_f\sigma_{aw}}\right)^2\right) \nu T_L$$

The gravity-corrected load factor $\gamma_{La}$ may then be found as the ratio between the design load and the characteristic load $$\gamma_{La} = \frac{L_{ad}}{L_a}$$

In the following, an example using the above-described approach is outlined. The gravity frequency $f_g$ (1P) and the dominating frequency for the wind $f_w$ will depend on the wind speed. The latter part is also dependent on the angle of the considered load. In the described example, the gravity frequency is chosen as the nominal 1P (0.17 Hz). The wind load has contributions from 1P, the flapwise frequency (0.55 Hz), and the edgewise frequency (0.85 Hz). An 'average' value of 0.4 Hz based on these is then chosen.

Based on the chosen frequencies, the gravity-corrected load factor is calculated using the equations given above for different ratios between the equivalent load from gravity and the total load, denoted η:

$$\eta = \frac{L_{ag}}{L_a}$$

Table 1 below illustrates the results for this particular example.

TABLE 1

| η | 0.2 | 0.3 | 0.4 | 0.5 | 0.6 | 0.7 | 0.8 | 0.9 |
|---|---|---|---|---|---|---|---|---|
| $\gamma_{L\alpha}$ | 0.99 | 0.98 | 0.97 | 0.96 | 0.95 | 0.94 | 0.93 | 0.91 |

The safety factor that for the gravity load is set based on the requirement that the associated probability of failure should be the same as (or less than) in the flapwise direction. In one example, the probability of failure of an insert at a root of the rotor blade is considered. In such an example, it may be determined that a load factor of 0.9 may be used for the gravity part (when a load factor of 1 is used for the wind part) by verification of the strength of the blade root.

A strength check of the designed rotor blade for the considered example is made from an SN-curve with a slope m=10 and by use of the Palmgren-Miner approach (as is known in the art). The applied limit state equation is given by $$g(t) = \Delta - \frac{N_{ref} \cdot t}{K \cdot T_L} \cdot X_{SCF}^m \cdot \left(\frac{X_\alpha L_\alpha X_G S_G}{A}\right)^m$$

where: $\Delta$ is the model uncertainty of the fatigue model and Palmgren-Miner sum; $N_{ref}$ is the number of fatigue load cycles for the equivalent load; t is time; $T_L$ is the design lifetime used for the equivalent load; m is the slope of the linear SN-curve; K is the material parameter of the linear SN-curve; $X_{SCF}$ is the uncertainty of the geometry and model uncertainty of local stress/strain effects; $X_\alpha$ is the combined uncertainty parameter for the total load in the direction $\alpha$; $X_G$ is the uncertainty parameter for a Goodman correction factor due to uncertainty of mean load; $S_G$ is the Goodman correction factor (as known in the art, and defined below); and, A is a sectional parameter defining a relation between load and nominal stress/strain.

The term describing the uncertainty of the load in the limit state equation $X_\alpha L_\alpha$ is determined from the equation including the confluent hypergeometric function above by introducing an uncertainty parameter $X_W$ related to the contribution from the wind and the parameter $X_g$ for gravity to obtain $$(X_\alpha L_\alpha)^m N_{ref} = \left(2\sqrt{2} X_W \sigma_{\alpha w}\right)^m \Gamma\left(1 + \frac{m}{2}\right) M\left(-\frac{m}{2}, 1, -\left(\frac{X_g \sigma_{\alpha g}}{X_W \sigma_{\alpha w}}\right)^2\right) \nu T_L$$

The load signal is given by a function l(t) and the mean value $\mu_{i\alpha}$. The Goodman correction factor is given by $$S_G = \frac{l_{ust}}{l_{ust} - \mu_{i\alpha}}$$

where $l_{ust}$ is the strength with respect to the ultimate load. The uncertainty with respect to the mean load is also considered, and it is represented by the parameter $X_{\mu l}$. The term covering the uncertainty with respect to the Goodman factor in the limit state equation $X_G S_G$ is then given by $$X_G S_G = \frac{l_{ust}}{l_{ust} - X_{\mu l} \mu_{i\alpha}}$$

The design equation is similar to the limit state equation and may be found by replacing uncertainty parameters with safety factors. The safety factor for the load is given by the gravity corrected load factor $\gamma_{La}$ (defined above), and the different safety factors used for the strength check are represented by the safety factor $\gamma_R$. The design equation then takes the form $$G(A) = 1 - \frac{N_{ref}}{K_c} \cdot (\gamma_{La} \gamma_R)^m \cdot \left(\frac{L_\alpha S_G}{A}\right)^m$$

where $K_C$ and $S_G$ are characteristic values of the material parameter in the SN-curve and the Goodman correction factor, respectively. The various uncertainty and safety factor values in the above may be chosen as appropriate.

Figure 2:
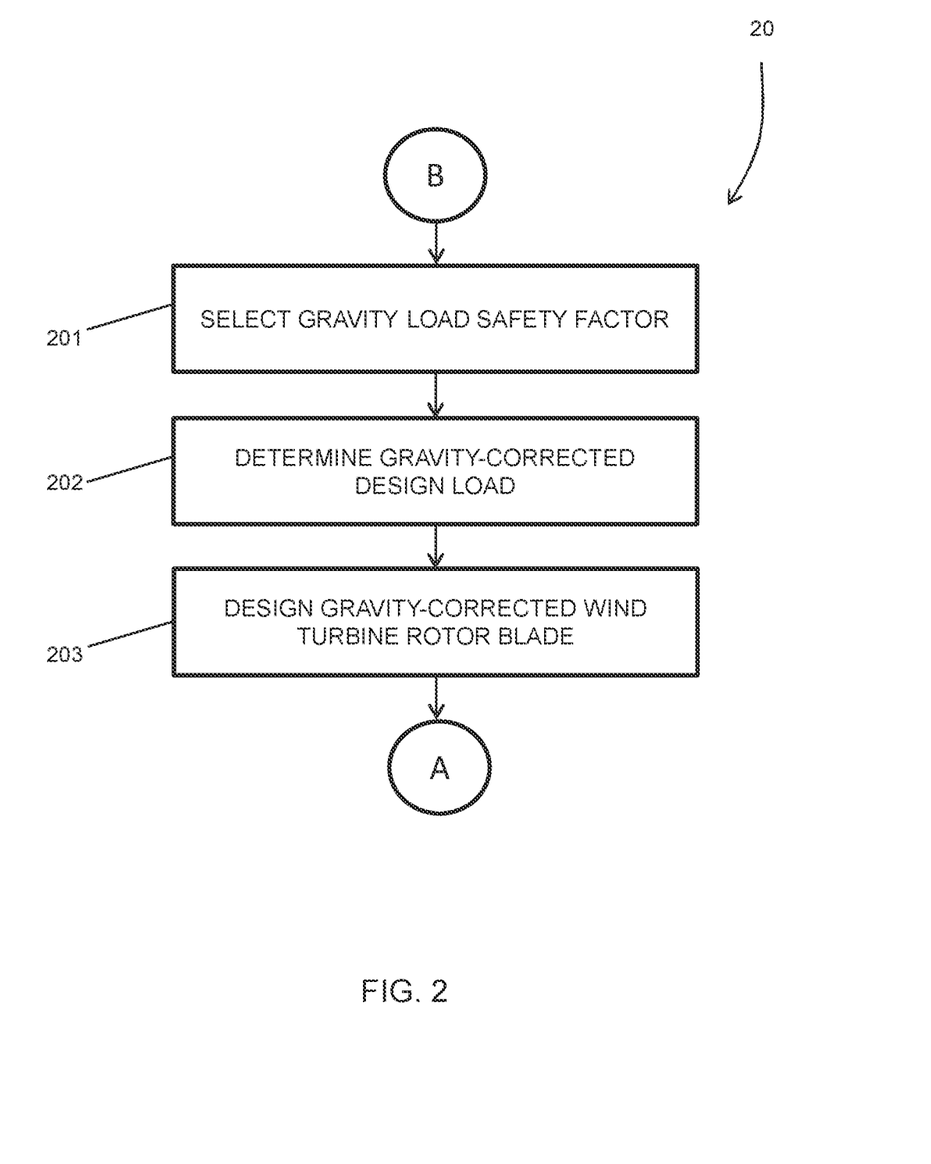
FIG. 2 illustrates steps of a method of designing the wind turbine rotor blade of FIG. 1 in accordance with an example of the invention.

FIG. 2 summarises steps of a method 20 of designing a wind turbine rotor blade 10 in accordance with the invention, in particular to beneficially use a lower safety factor for the gravity part of blade fatigue loading. At step 201, the method 20 involves selecting a so-called gravity load safety factor associated with wind turbine rotor blade fatigue loading due to gravity. In particular, the gravity load safety factor is selected to be less than a defined wind load safety factor associated with wind turbine rotor blade fatigue loading that is not due to gravity. That is, the safety factor associated with the gravity part of the loading is to be less than the safety factor associated with the part of the gravity not caused by gravity, referred to as the 'wind part' or 'wind load' as the loading may be regarded as predominantly arising because of the wind conditions. The wind load safety factor may be defined to be equal to the standard load safety factor for fatigue loading. For instance, this may be obtained from an industry standard or other literature. In one example, this standard load safety factor is equal to one.

At step 202, the method 20 involves determining a so-called 'gravity-corrected design load' for wind turbine rotor blade deflection or bending in an arbitrary direction. The gravity-corrected design load is determined based on the selected gravity load safety factor and the defined wind load safety factor. In particular, the gravity-corrected design load may be determined by applying the respective safety factors to gravity and wind (non-gravity) parts of the blade loads. These blade loads may be obtained by simulation, for example, as outlined above. At step 203, the method 40 involves designing a so-called 'gravity-corrected wind turbine rotor blade' in accordance with the determined gravity-corrected design load.

As mentioned above, it needs to be determined what value the gravity load safety factor should be set to. A probability of failure associated with the reduced gravity load safety factor may be beneficially of a similar magnitude, or less than, a reference probability of failure that may be indicative of a failure probability when a standard load factor is used for fatigue loading. This may require an iterative approach to obtain an optimal value for the gravity load safety factor. For instance, a gravity-corrected probability of failure of the designed gravity-corrected rotor blade for a fatigue failure mode due to blade deflection may be determined. If the determined gravity-corrected probability of failure is greater than the reference probability of failure for the fatigue failure mode, then the selected gravity load safety factor may be increased, and the steps of designing a gravity-corrected rotor blade and comparing its determined probability of failure for a fatigue failure mode relative to the reference probability of failure are performed. This may be repeated until the designed blade has an acceptable gravity-corrected probability of failure. Once a designed blade satisfies all of the requirements in terms of structural integrity, the method may involve manufacturing a rotor blade in accordance with the determined design.

Figure 3:
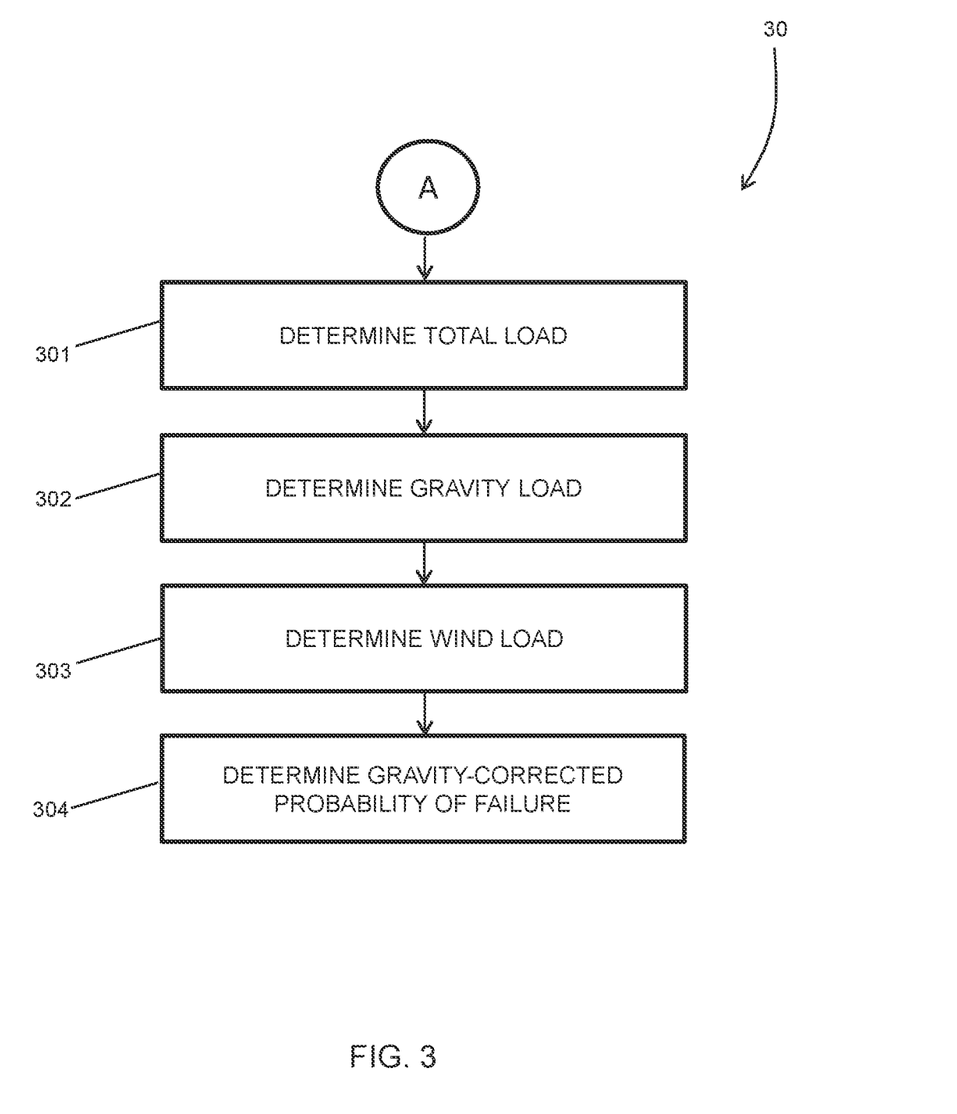
FIG. 3 illustrates further steps of the method of FIG. 2 in accordance with an example of the invention; and, FIG. 4 illustrates further steps of the method of FIG. 2 in accordance with an example of the invention.

FIG. 3 summarises the steps of a method 30 that may be used to ensure the designed rotor blade has an acceptable probability of failure for a fatigue failure mode. As indicated by 'A', these method steps may follow those outlined in FIG. 3. At step 301, a defined total load model may be used to predict a total load indicative of fatigue loading of the designed gravity-corrected rotor blade during wind turbine operation. This may be a load model as outlined above. At step 302, a defined gravity load model may be used to predict a gravity load indicative of fatigue loading due to gravity of the designed gravity-corrected rotor blade during wind turbine operation. As outlined above, the gravity load model may be equivalent to the total load model but with certain parameters changed/set to different values. For instance, the gravity load simulation may include setting one or both of a turbulence parameter and a wind shear parameter in the load model to be equal to, or substantially equal to, zero. Alternatively, or in addition, the gravity load simulation may include increasing the value of a structural damping parameter for flapwise and edgewise oscillations of the designed rotor blade by at least one, and preferably more, orders of magnitude.

At step 303, a wind load signal indicative of fatigue loading not due to gravity of the designed gravity-corrected rotor blade during wind turbine operation may be determined. The wind load signal may be determined based on the total load and the gravity load. At step 304, the gravity-corrected probability of failure may then be determined based on a limit state equation including an uncertainty associated with a signal indicative of the gravity load and an uncertainty associated with the wind load signal.

A blade may be designed according to a design equation as outlined above. As part of the design process, the amount of material used is found. This is represented by the area A, so that G(A) becoming zero in the above equation corresponds to a 'damage' of 1.0. It is noted that the load safety factor is used in this equation. Then, after the blade has been designed, the probability of failure may be calculated. The limit state equation outlined above is used for this purpose. It is noted that different uncertainties are used here, as given by the X variables in the equation. Failure of the blade occurs when g(t) becomes less than zero, corresponding to a damage level higher than 1.0. These uncertainties are stochastic variables, i.e. they are defined by a probability distribution, and so g(t) is also a stochastic variable defined by a probability distribution. The probability of failure is then determined by determining the probability of g(t) becoming less than zero for a defined value of t, e.g. t=20 years.

If the gravity-corrected probability of failure is of a similar magnitude to, or less than, the reference probability of failure, then the current gravity load safety factor may be maintained, along with the designed rotor blade. However, if the gravity-corrected probability of failure is greater than the reference value, then the process may return to step 201 to select an updated, greater gravity load safety factor, with the following steps in FIGS. 2 and 3 then being repeated for this updated value. This iterative process may continue until a gravity load safety factor is obtained that has an associated gravity-corrected probability of failure that is deemed to be acceptable (while still being lower than a standard load safety factor).

Figure 4:
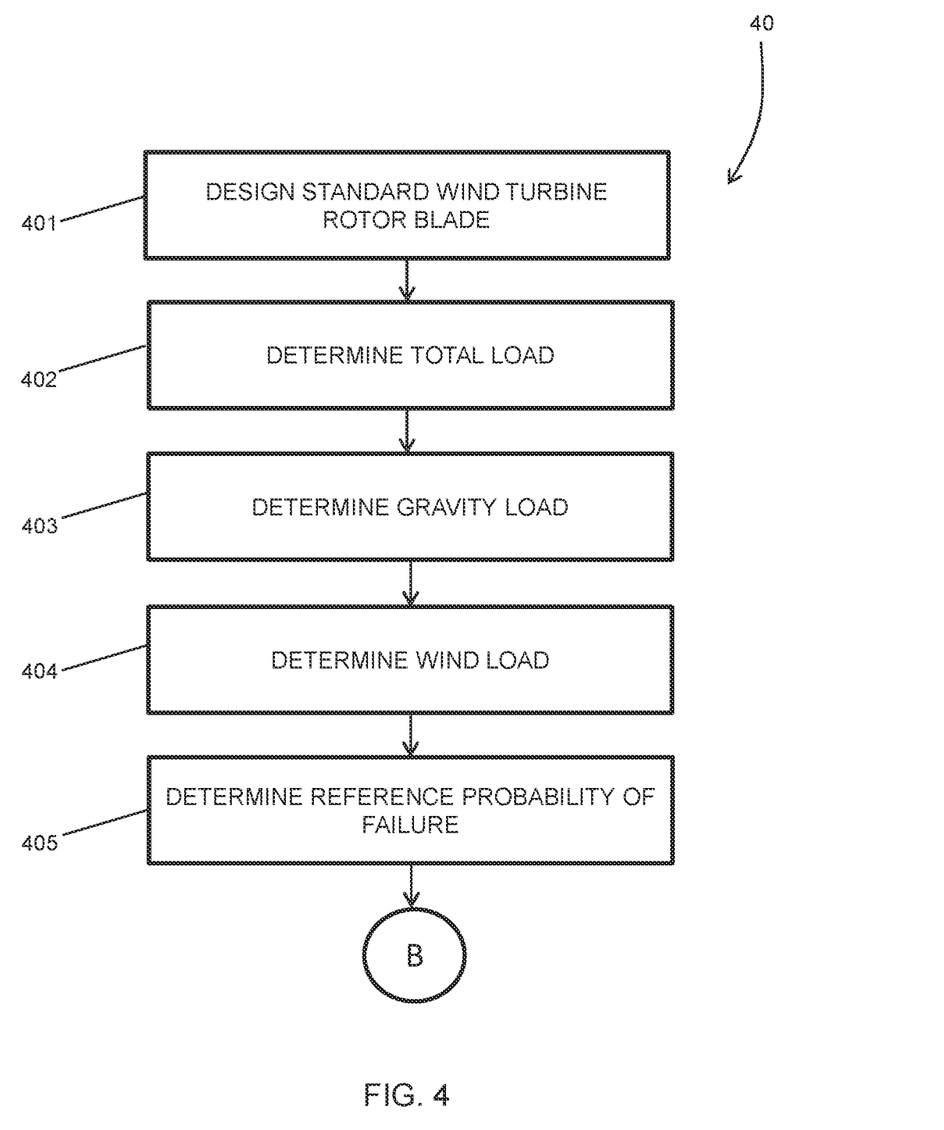

As outlined above, the reference probability of failure may be determined with reference to a (standard) blade design in accordance with a standard load safety factor. FIG. 4 summarises steps of a method 40 that may be used for determining this reference value in accordance with an example of the invention. As indicated by 'B', these method steps may precede those outlined in FIG. 2. At step 401, a (standard) wind turbine rotor blade may be designed in accordance with a 'standard' design load that is based on a 'standard' load safety factor associated with wind turbine rotor blade fatigue loading. As mentioned above, this may be obtained from an industry standard or other literature, and may be equal to one.

At step 402, a defined total load model may be used to predict or simulate a total load indicative of fatigue loading of the standard rotor blade during wind turbine operation. Again, this may be a load model as outlined above. At step 403, a defined gravity load model may be used to predict a gravity load indicative of fatigue loading of the standard rotor blade during wind turbine operation. Again, the gravity load model may be equivalent to the total load model but with certain parameters changed/set to different values to minimise or removing the effects of the wind on blade loading.

At step 404, a wind load signal indicative of fatigue loading not due to gravity of the standard rotor blade during wind turbine operation is determined based on the total and gravity loads for the standard rotor blade. As outlined above, the wind load signal may be a standard deviation of the fatigue loading not due to gravity of the standard rotor blade during wind turbine operation. In particular, this standard deviation wind load signal may be determined based on a determined standard deviation of the gravity load. Then, the gravity-corrected design load may be determined based on the gravity load safety factor applied to the gravity load standard deviation for the standard rotor blade and on the wind load safety factor applied to the standard deviation of the fatigue loading not due to gravity of the standard rotor blade.

At step 405, the reference probability of failure is determined. In particular, this may be a probability of failure of the standard rotor blade for the fatigue failure mode due to blade deflection in a flapwise direction. Specifically, the reference probability of failure may be determined based on a limit state equation including an uncertainty associated with the wind load signal for the standard rotor blade.

Many modifications may be made to the described examples without departing from the scope of the appended claims.

The above describes a method of designing a wind turbine rotor blade that uses a reduced load safety factor for the gravity part of fatigue loading compared with a (standard) load safety factor for the wind part (or non-gravity part) of fatigue loading, in order to reduce the amount of material needed for the rotor blade. It will be understood, however, that the described approach may be used in the design and manufacture of other wind turbine (structural) components that need to be designed to withstand loading that results from gravity and wind effects. Such structural components may include a main bearing or nacelle frame of the wind turbine. In general, structural components that are influenced by wind turbine rotor loads may be designed in accordance with the approach described herein. In particular, for a given structural component of the wind turbine, a reference probability of failure may be calculated for a standard or initial design of the structural component. The load experienced by the structural component may then be split into a gravity part and a wind part, in a corresponding manner to the method described above. A lower safety factor is then selected for the wind part (relative to a standard load factor). A new design of the structural component with the reduced design load is then created. A check is performed as to whether the probability of failure of the newly-designed structural component is less than or equal to a reference probability of failure. As above, this method can be performed in an iterative manner until an appropriate design is obtained for the structural component.

The invention claimed is:

1. A method of designing a wind turbine rotor blade, the method comprising:
   a) selecting a gravity load safety factor associated with wind turbine rotor blade fatigue loading due to gravity, the gravity load safety factor being selected to be less than a defined wind load safety factor associated with wind turbine rotor blade fatigue loading that is not due to gravity;
   b) determining a gravity-corrected design load for wind turbine rotor blade deflection, the gravity-corrected design load being determined based on the selected gravity load safety factor and the defined wind load safety factor;
   c) designing, by a processor, a gravity-corrected wind turbine rotor blade in accordance with the determined gravity-corrected design load;
   d) determining a gravity-corrected probability of failure of the designed gravity-corrected rotor blade for a fatigue failure mode due to blade deflection; and
   e) when the determined gravity-corrected probability of failure is greater than a reference probability of failure for the fatigue failure mode, increasing the selected gravity load safety factor and repeating steps b) and c).

2. The method of claim 1, wherein determining the gravity-corrected probability of failure comprises specifying a direction of blade deflection for the fatigue failure mode.

3. The method of claim 1, the method further comprising:
   using a defined total load model to predict a total load indicative of fatigue loading of the designed gravity-corrected rotor blade during wind turbine operation;
   using a defined gravity load model to predict a gravity load indicative of fatigue loading due to gravity of the designed gravity-corrected rotor blade during wind turbine operation; and
   determining a wind load signal indicative of fatigue loading not due to gravity of the designed gravity-corrected rotor blade during wind turbine operation, the wind load signal being determined based on the total load and the gravity load,
   wherein the gravity-corrected probability of failure is determined based on a limit state equation including an uncertainty associated with a signal indicative of the gravity load and an uncertainty associated with the wind load signal.

4. The method of claim 3, wherein defining the gravity load model comprises setting one or more parameters of the defined total load model as follows:
   setting a turbulence parameter substantially equal to zero;
   setting a wind shear parameter substantially equal to zero; and
   increasing a value of a structural damping parameter for flapwise and edgewise oscillations of the designed rotor blade by at least one order of magnitude.

5. The method of claim 1, the method further comprising:
   designing a standard wind turbine rotor blade in accordance with a standard design load that is based on a standard load safety factor associated with wind turbine rotor blade fatigue loading; and
   determining the reference probability of failure as a probability of failure of the standard wind turbine rotor blade for the fatigue failure mode due to blade deflection in a flapwise direction.

6. The method of claim 5, the method further comprising:
   using a defined total load model to predict a total load indicative of fatigue loading of the standard wind turbine rotor blade during wind turbine operation;
   using a defined gravity load model to predict a gravity load indicative of fatigue loading of the standard wind turbine rotor blade during wind turbine operation; and,
   determining a wind load signal indicative of fatigue loading not due to gravity of the standard wind turbine rotor blade during wind turbine operation based on the total and gravity loads for the standard wind turbine rotor blade,
   wherein the reference probability of failure is determined based on the standard load safety factor applied to an uncertainty associated with the wind load signal for the standard wind turbine rotor blade.

7. The method of claim 6, wherein the wind load safety factor is defined to be equal to the standard load safety factor.

8. The method of claim 6, wherein the gravity-corrected design load is determined based on the gravity load safety factor applied to a signal indicative of the gravity load for the standard wind turbine rotor blade and on the wind load safety factor applied to the wind load signal for the standard wind turbine rotor blade.

9. The method of claim 8, wherein the wind load signal is a standard deviation of the fatigue loading not due to gravity of the standard wind turbine rotor blade during wind turbine operation, wherein the wind load signal is determined based on a determined standard deviation of the gravity load, and wherein the gravity-corrected design load is determined based on the gravity load safety factor applied to the standard deviation of the gravity load for the standard wind turbine rotor blade and on the wind load safety factor applied to the standard deviation of the fatigue loading not due to gravity of the standard wind turbine rotor blade.

10. The method of claim 9, wherein the standard deviation $\sigma_{ag}$ of the gravity load is obtained according to $L_{ag}^m N_{ref} = (2\sqrt{2}\sigma_{ag})^m f_g T_L$ where m is a considered slope of an SN-curve, $T_L$ is a design lifetime of the rotor blade, $L_{ag}$ is the gravity load for a reference number of load cycles $N_{ref}$, and $f_g$ is a frequency of a sinusoidal load signal corresponding to a frequency of the gravity load.

11. The method of claim 10, wherein the standard deviation $\sigma_{aw}$ of the fatigue loading not due to gravity is obtained according to $$L_a^m N_{ref} = \left(2\sqrt{2}\sigma_{ag}\right)^m \Gamma\left(1 + \frac{m}{2}\right) M\left(-\frac{m}{2}, 1, -\left(\frac{\sigma_{ag}}{\sigma_{aw}}\right)^2\right) \nu T_L$$

where $L_\alpha$ is the total load for the reference number of load cycles $$N_{ref}, M\left(-\frac{m}{2}, 1, -\left(\frac{\sigma_{\alpha g}}{\sigma_{\alpha w}}\right)^2\right)$$

is a confluent hypergeometric function, and v is an average frequency of load cycles.

12. The method of claim 1, wherein the gravity load safety factor is selected to be equal to 0.9.

13. The method of claim 1, the method further comprising manufacturing the wind turbine rotor blade designed in accordance with the determined gravity-corrected design load.

14. A system comprising:
   a memory; and
   a processor communicatively coupled to the memory, the processor configured to:
   a) select a gravity load safety factor associated with wind turbine rotor blade fatigue loading due to gravity, the gravity load safety factor being selected to be less than a defined wind load safety factor associated with wind turbine rotor blade fatigue loading that is not due to gravity;
   b) determine a gravity-corrected design load for wind turbine rotor blade deflection, the gravity-corrected design load being determined based on the selected gravity load safety factor and the defined wind load safety factor;
   c) design a gravity-corrected wind turbine rotor blade in accordance with the determined gravity-corrected design load;
   d) determine a gravity-corrected probability of failure of the designed gravity-corrected rotor blade for a fatigue failure mode due to blade deflection; and
   e) when the determined gravity-corrected probability of failure is greater than a reference probability of failure for the fatigue failure mode, increase the selected gravity load safety factor and repeating steps b) and c).

* * * * *